Figure 1:
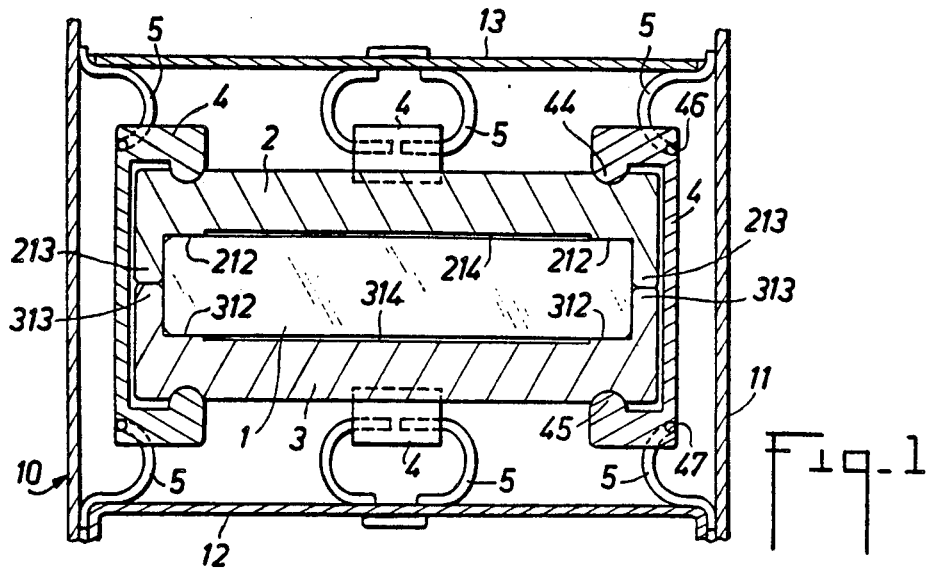

United States Patent [19]

Besson et al.

[11] Patent Number: 4,705,982
[45] Date of Patent: Nov. 10, 1987

[54] DEVICE FOR SUPPORTING A PIEZOELECTRIC RESONATOR INSIDE A CASING

[75] Inventors: Raymond Besson, Besancon; Richard Delaite, Belfort; Gérard Genestier; Pierre Maitre, both of Besancon; Georges Renard, Pouilley-Francais; Daniel Thiebaud, Besancon; Jean-Pascal Valentin, Pouilley les Vignes, all of France

[73] Assignee: Ecole Nationale Superieure de Mecanique et des Microtechniques, Besancon, France

[21] Appl. No.: 872,530

[22] Filed: Jun. 10, 1986

[30] Foreign Application Priority Data

Jun. 14, 1985 [FR] France ............................. 85 09097

[51] Int. Cl.$^4$ ............................................. H01L 41/08
[52] U.S. Cl. ..................................... 310/356; 310/348; 248/603
[58] Field of Search .................... 248/581, 603-606, 248/610-612, 638, 27.3; 206/583, 806; 335/271, 277; 310/354-356, 348

[56] References Cited

U.S. PATENT DOCUMENTS

| | | | |
|---|---|---|---|
| 2,078,284 | 4/1987 | Schrader | 310/356 |
| 2,392,993 | 1/1946 | Morse | 310/356 |
| 2,410,193 | 10/1946 | Bach | 310/355 |
| 2,438,708 | 3/1948 | Kuenstler | 310/356 |
| 2,464,046 | 3/1949 | Kuenstler | 310/356 |
| 2,488,781 | 11/1949 | Reeves | 310/356 |
| 2,504,493 | 4/1950 | Brownshield | 310/356 |
| 3,073,975 | 1/1963 | Bigler | 310/348 |
| 3,339,091 | 5/1964 | Hammond et al. | |
| 3,700,097 | 10/1972 | Thomas | 206/583 |
| 4,464,598 | 8/1984 | Besson | 310/348 |
| 4,471,259 | 9/1984 | Stoermer | 310/348 |
| 4,524,295 | 6/1985 | Allensworth | 310/348 |

FOREIGN PATENT DOCUMENTS 981236 5/1951 France .
1407793 9/1975 United Kingdom .

Primary Examiner—J. Franklin Foss
Assistant Examiner—Robert A. Olson
Attorney, Agent, or Firm—Shenier & O'Connor

[57] ABSTRACT

Device for supporting a piezoelectric resonator inside a casing. The device comprises two cross-shaped half-shells, each one comprising: four branches of which the free ends define angle pieces with a horizontal bearing surface of small dimension, which surface is slightly raised with respect to the central part of the corresponding half-shell, as well as one vertical branch holding the edge of the resonator: four identical independent securing flanges to secure the two half-shells in position, said flanges having the shape of a turned down U, each flange comprising, at the end of each branch of the U, two stop elements bearing against two superposed branches of the two half-shells, on the faces of those branches facing said horizontal bearing surfaces; and at least four pairs of springs for suspending the four securing flanges with respect to the casing. The symmetry of the device assembly with respect to three axes perpendicular one to the other, and the shape of the different elements considerably limit the influence of any external radial or axial effects on the resonator.

8 Claims, 8 Drawing Figures

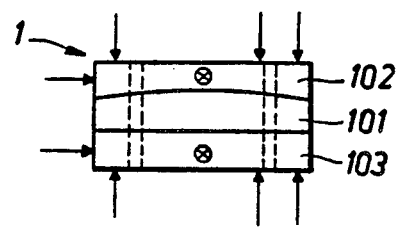
Fig.4
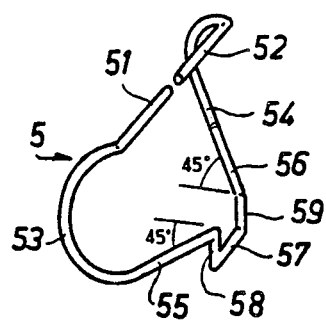
Fig.5
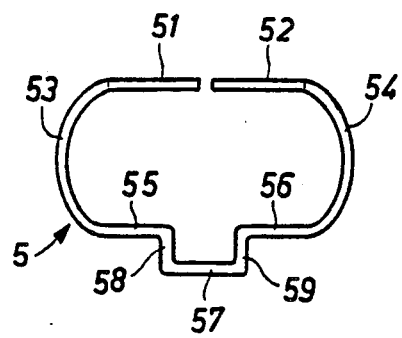
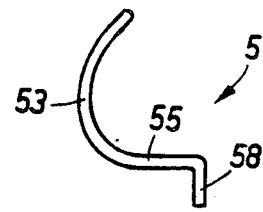
Fig.6
Fig.7
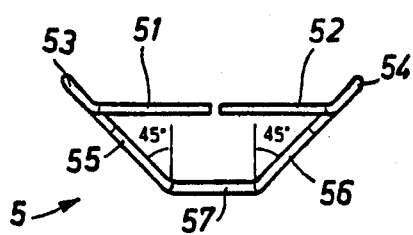
Fig.8

DEVICE FOR SUPPORTING A PIEZOELECTRIC RESONATOR INSIDE A CASING

The present invention which is the result of works carried out by Messrs. R. Besson, R. Delaite, G. Genestier, P. Maitre, G. Renard, D. Thiebaud and J. P. Valentin, from the Laboratory of Chronometry, Electronics and Piezo-electricity, of the Ecole Nationale Supérieure de Mécanique et des Micro-techniques of the University of Franche-Comté - Besancon, relates to mechanical structures for supporting piezoelectric resonators, and in particular to a device for supporting a piezoelectric resonator inside a casing.

Various examples of piezoelectric resonators are already known.

According to one conventional example, a crystal resonator is constituted by a planoconvex or biconvex quartz plate, of circular contour, on the front faces of which plate are directly deposited metallic electrodes, known as adhering electrodes.

According to another example of embodiment, the quartz plate with adhering electrodes is limited on the outside by a quartz ring used for supporting the crystal resonator.

According to yet another example of embodiment, said crystal resonator is connected to a quartz ring via bridges cut through the mass. The electrodes may be adhering or non-adhering. In the latter case, the electrodes are deposited over quartz plates having the same contour and shape as the crystal, and only the rings of the plates supporting the electrodes are in contact with the ring of the vibrating part of the crystal.

Whatever the type of resonator used, it is generally necessary to incorporate said resonator in a protective casing which, in addition to being sealed, further permits the creation of a space inside which there is a high or low vacuum which improves the working conditions of the resonator, hence its quality.

The casing and the crystal resonator have however different thermal and mechanical properties, so that it is necessary to provide a special mechanical structure in order to limit the influence of external perturbations by concentrating a minimum of stresses in the center of the crystal.

It is not possible with the mechanical structures used heretofore for supporting resonators, to sufficiently limit the influence of radial or axial effects on the resonator crystal, whether these effects are due to the mounting or to the environment conditions.

Moreover, the said known mechanical structures for supporting resonators which are often specific to one very particular type of resonator, are delicate to use.

It is the object of the present invention to overcome the aforesaid disadvantages by proposing a mechanical device for supporting a resonator, which is of simple design and, as such, applicable to different types of piezoelectric resonators, and which gives the possibility of reducing to a minimum the relative variations of frequency of the resonator under the effect of accelerometric, thermal or pressure perturbations, thus increasing its stability in time to a maximum and lengthening its working life as much as possible.

These objects are reached with a device for supporting a piezoelectric resonator inside a casing, which device comprises;

first and second identical half-shells for positioning the resonator, said half-shells being in a material of same nature and design as the material constituting the resonator, and each one being cross-shaped and comprising four branches of which the free ends define angle pieces with a horizontal bearing surface of small dimension, which surface is slightly raised with respect to the central part of the corresponding half-shell, as well as one vertical branch holding the edge of the resonator;

four identical independent securing flanges to secure the two half-shells in position, said flanges having the shape of a turned down U, each flange comprising, at the end of each branch of the U, two stop elements bearing against two superposed branches of the two half-shells, on the faces of those branches facing said horizontal bearing surfaces; and at least four pairs of springs for suspending the four securing flanges with respect to the casing.

Advantageously, the stop elements of the flanges are semicircular in shape and cooperate with corresponding semi-circular parts formed on the external faces of the branches of the halfshells to constitute a coupling of the groove-rib type with a semicylindrical profile.

The flanges are produced in a material having a coefficient of thermal expansion in axial direction of the resonator, virtually identical to that of the material constituting the resonator.

According to one particular embodiment of the invention, each flange has a flat back face in which are formed two grooves for receiving suspension springs.

And according to a special feature, each spring is constituted by a round metallic wire in an alloy having a high elastic limit, said wire being so shaped as to be able to withstand twisting and bending stresses.

According to yet another embodiment, providing a very good immunity to shocks, each spring is symmetrical with respect to a vertical median plane of a flange, and each half-spring comprises a first rectilinear horizontal part which is designed to fit in a groove of the receiving flange, a curved vertical part placed outside the receiving flange, a second rectilinear horizontal part joined to the end of the curved vertical part distant from the first horizontal part, a second vertical part of short length joined to the end of the second horizontal part distant from the curved vertical part and a third rectilinear horizontal part of short length joined to the end of the second vertical part distant from the second horizontal part, the curved vertical part and the second horizontal part being situated inside a plane forming an angle of 45° with respect to the plane of symmetry of the spring.

In general, the half-shells, the four flanges and the pairs of springs are all symmetrical with respect to two axial planes of the resonator, which planes are perpendicular one with respect to the other, and with respect to a radial median plane of the resonator.

Figure 2:
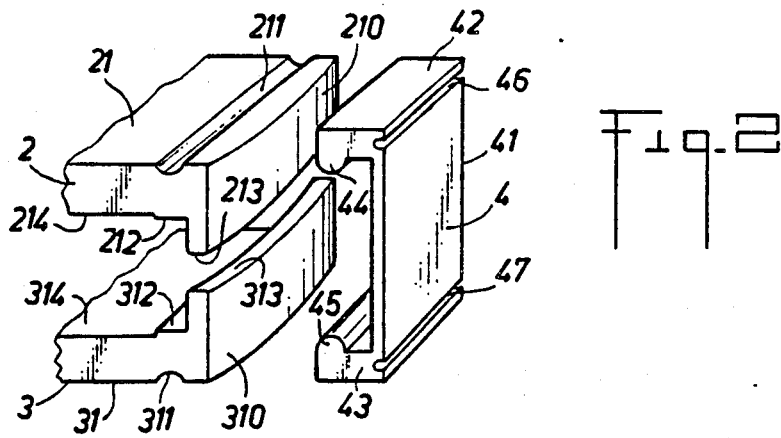
Figure 3:
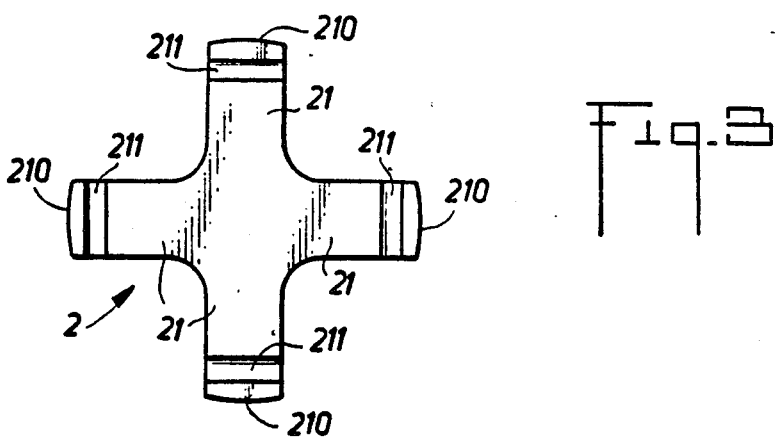

The invention will be more readily understood on reading the following description with reference to the accompanying drawings in which:

FIG. 1 is an axial section taken along a plane of symmetry of a casinging incorporating a resonator-supporting device according to the invention, FIG. 2 is a detailed perspective showing the combination of the branches of two positioning half-shells and one securing flange in the supporting device shown in FIG. 1, FIG. 3 is a plan view of the upper half-shell of the supporting device according to FIG. 1, FIG. 4 is an elevational view of one example of a structure of quartz resonator with non-adhering electrodes, with which the supporting device according to the invention can be used, FIG. 5 is a perspective view of one example of spring which can be used in the device shown in FIG. 1, and FIGS. 6 to 8 are, respectively, front, side and plan views of the spring shown in FIG. 5.

Referring first to FIG. 1, this diagrammatically shows a casing 10 with side walls 11, of cylindrical shape for example, a base 12 and an upper closing plate 13, a resonator 1 being mounted in said casing by means of a supporting device composed of two half-shells 2,3 for positioning the resonator 1, four flanges 4 for securing the half-shells 2,3 with respect to the resonator 1, and eight springs 5 ensuring the suspension, with respect to the casing 10, of the compact assembly composed of the resonator 1, the positioning half-shells 2,3 and the securing flanges 4.

The supporting device assembly according to the invention is so designed as to be entirely symmetrical with respect to two axial planes of the resonator 1 perpendicular one to the other, and with respect to a median radial plane of the resonator 1.

In this way, the actions due to external perturbations (such as speeding, shocks, vibrations, pressure) cannot transmit any twisting or bending moments to the center of the crystal.

The resonator 1 can be constituted by a crystal resonator with adhering electrodes, namely by a plate in a piezoelectric material of given shape, on the main faces of which are deposited the metallic electrodes.

Yet the resonator 1 may also be constituted by a more complex assembly, such as that shown in elevation in FIG. 4, with a crystal resonator 101 constituted, as in the preceding example, by a plate in piezoelectric material such as of the plano-convex type, but without electrodes, and presenting an external support ring joined to the central active part of the crystal via thinned bridges, and by two plates 102, 103, each one having likewise an external supporting ring, bearing against the external ring of the actual crystal, so as to form, at the level of the three rings, a stack of interconnected surfaces. In this case, the central parts of the faces of the plates 102, 103 situated in facing relation to the crystal 101, and without contact therewith, carry exciting electrodes called non-adhering electrodes. The compact assembly constituted by the crystal 101 and the electrodes-carrying plates 102, 103 can then be considered, as a whole, as a resonator with adhering electrodes and the elements of the support device act on the external rings of the electrode-supporting plates, whereas in the case of a resonator with adhering electrodes, the support device is in contact with the peripheral part of the actual crystal resonator.

A special description of each functional sub-assembly of the supporting device according to the invention is given hereunder.

The sub-assembly for positioning the resonator 1 comprises two upper and lower half-shells 2,3 which are cross-shaped and made from a material which is identical to that constituting the resonator, and of similar contour, in order to eliminate any differential expansion, said half-shells being identical in order to preserve the symmetry with respect to the plane of the crystal of resonator 1.

Each half-shell 2,3 comprises four branches 21, 31, forming a cross at 90° one from the other (FIGS. 2 and 3), each one being provided at its end with a bearing surface 212, 213 of small dimension and raised with respect to the central part 214, 314 of one face, in order to contact, in four areas of limited surface situated at 90° one from the other, with the peripheral part of a front face of the resonator 1. The four bearing surfaces 212, 312 of each half-shells 2,3 thus define two support planes on the periphery of the resonator 1. The small contacting surface enables a limitation of the stresses on the resonator 1. The ends 210, 310 of the branches 21, 31 of the half-shells 2,3 also have a part 213, 313 projecting at right angle with respect to the plane of the corresponding branch 21, 31 so as to form a holding means on the side of the resonator edge and to achieve a centering of the resonator 1, without, however exerting any pressure thereon in the radial direction, then avoiding any transversal compressions of the resonator 1 and reducing any strain releases in the crystal.

The sub-assembly of the supporting device which immobilizes the resonator fixed by the two half-shells 2,3, comprises four flanges arranged at 90° one from the other, each one cooperating, on the one hand, with a branch 21 of the upper half-shell 2, and on the other hand, with the branch 31 of the lower half-shell 3 which is superposed to the branch 21 in question of the upper half-shell.

Each flange 4 has the shape of a turned down U and comprises a flat vertical part 41 in the rear face of which are provided two horizontal grooves 46, 47 close to the side branches 42, 43 of the flange. Each branch 42, 43 of one flange 4 is provided at its end, on the face of the branch 42, 43 which is turned inwards, with a horizontal semi-cylindrical projection 44, 45 which is designed to come into engagement in a semi-cylindrical groove of corresponding shape 211,311 provided in the external face of a branch 21,31 of one of the half-shells 2,3 in the area of the branch facing the part 212,312 in contact with the resonator 1 (FIG. 2).

The gripping action exerted by the flanges 4 on the halfshells 2,3 is such that it transmits no bending moment to the compact assembly constituted by the resonator crystal 1 and its electrodes and half-shells 2,3. Indeed the gripping forces applied by the four flanges are identical, co-linear and exerted perpendicularly to the eight bearing portions 212,312 of reduced surface of the half-shells 2,3.

At the level of the contact of the half-shells 2,3 with the flanges 4, the stresses are reduced by the choice of a complementary cylindrical shape for elements 44, 211 or 45,311 of the groove projection type connection.

In order to prevent any variations of compression due to the flanges 4 during variations in temperature, the material selected for the flanges has a coefficient of thermal expansion which, in the axial direction, is identical to, or very near that of the crystal 1. For a quartz crystal, a material of the type known under the denomination PHYNOX can be selected.

The fact that the gripping of the half-shells 2,3 is achieved by means of four independent flanges 4 permits to eliminate the effect of the transversal differential expansions which could be due to the differences in the characteristics of the materials. In these conditions, the radial expansions of the crystal can be exerted freely.

The "suspension" function of the crystal assembly 1 with its electrodes, half-shells 2,3 and flanges 4 inside the casing 10 is achieved by eight identical springs 5 joining the flanges 4 to the casing 10.

The springs 5 isolate the sensitive part of the resonator 1 from external strains applied on the casing 10 and compensate for any manufacturing defects between the different assembled elements.

The suspension is designed in a symmetrical manner, so that any effects due to external perturbations (such as accelerations, shocks, vibrations, pressure) cannot transmit any twisting or bending moments to the center of the crystal. Eight springs 5 are thus arranged in pairs at 90° one from the other, each pair of springs 8 acting on the lower and upper parts of one flange 4. The location of the springs 5, their particular design illustrated in FIGS. 5 to 8 and the use of round wire to produce them give the added guarantees that the elastic center of the suspension coincides with the center of gravity of the mass of the system, that the three degrees of freedom are in translation, and that three identical coefficient of rigidity are associated to these three degrees of freedom.

In these conditions, the assembly can be subjected to shocks; it is the suspension which can "absorb" them and reduce their effects to a minimum. Since the springs 5 can withstand twisting and bending, they should be produced in a special alloy with a high elastic limit (such as for example the alloy known as PHYNOX). Since said springs 5 ensure the connection with the casing 10, they are simply embedded. The springs situated at the bottom are fitted between the hood 11 and the base 12 which constitutes a cover. The springs at the top are embedded between the hood 11 and for example a special washer added at the level of the bottom 13, which washer is elastic and is provided with small notches for positioning the springs, in the case where the bottom 13 is not constituted by a lid. The connection is made by soldering, the relative positioning being achieved by the two grooves 46,47 cut in the back of each flange (FIG. 2).

According to the special embodiment illustrated in FIGS. 5 to 8, each spring 5 is symmetrical with respect to a plane which corresponds to the vertical median plane of a flange 4.

Each half-spring comprises a first rectilinear horizontal part 51,52 designed to come into engagement into a groove 46,47 of the receiving flange 43, a curved vertical part 53,54 placed outside the receiving flange 4, a second rectilinear horizontal part 55,56 joined to the end of the curved vertical part 53,54 distant from the first horizontal part 51,52, a second vertical part 58,59 of short length joined to the end of the second horizontal part 55,56 distant from the curved vertical part 53,54 and a third rectilinear horizontal part 57 of short length joined to the end of the second vertical part 58,59 distant from the second horizontal part 55,56. The curved vertical part 53,54 of semi-circular shape and the second horizontal part 55,56 are in a plane forming an angle of 45° with the plane of symmetry of the spring.

In FIG. 5, the spring 5 is so positioned that the horizontal branches 51,52 are ready to engage in the groove 47 of the flange 4 of FIG. 2 in order to constitute an element of lower suspension.

What is claimed is:

1. A piezoelectric device comprising a casing, a piezoelectric resonator and supporting means for supporting the piezoelectric resonator inside the casing wherein said supporting means comprises:

first and second identical half-shells for positioning the resonator, said half-shells being a material of same nature and design as the material constituting the resonator, and each one being cross-shaped and comprising four branches of which the free ends define angle pieces with a horizontal hearing surface of small dimension, which surface is slightly raised with respect to the central part of the corresponding half-shell, as well as one vertical branch holding the edge of the resonator;

four identical independent securing flanges to secure the two half-shells in position, said flanges having the shape of a turned down U, each flange comprising, at the end of each branch of the U, two stop elements bearing against two superposed branches of the two half-shells, on the faces of those branches facing said horizontal bearing surfaces; and at least four pairs of springs for suspending the four securing flanges with respect to the casing.

2. A device as claimed in claim 1, wherein the stop elements of the flanges are semi-circular in shape and cooperate with corresponding semi-circular parts formed on the external faces of the branches of the half-shells to constitute a coupling of the groove-rib type with a semi-cylindrical profile.

3. A device as claimed in claim 1, wherein the flanges are produced in a material having a coefficient of thermal expansion in axial direction of the resonator, virtually identical to that of the material constituting the resonator.

4. A device as claimed in claim 1, wherein each flange has a flat back face in which are formed two grooves for receiving suspension springs.

5. A device as claimed in claim 4, wherein each spring is constituted by a round metallic wire in an alloy having a high elastic limit, said wire being so shaped as to be able to withstand twisting and bending stresses.

6. A device as claimed in claim 5, wherein each spring is symmetrical with respect to a vertical median plane of a flange, and each half-spring comprises a first rectilinear horizontal part which is designed to fit in a groove of the receiving flange, a curved vertical part placed outside the receiving flange, a second rectilinear horizontal part joined to the end of the curved vertical part distant from the first horizontal part, a second vertical part of short length joined to the end of the second horizontal part distant from the curved vertical part and a third rectilinear horizontal part of short length joined to the end of the second vertical part distant from the second horizontal part, the curved vertical part and the second horizontal part being situated inside a plane forming an angle of 45° with respect to the plane of symmetry of the spring.

7. A device as claimed in claim 4, wherein each spring is embedded at one of its ends between on the one hand, the side wall of the casing, and on the other hand, the upper wall or the base of the casing.

8. A device as claimed in claim 1, wherein the half-shells, the four flanges and the pairs of springs are all symmetrical with respect to two axial planes of the resonator, which planes are perpendicular one with respect to the other, and with respect to a radial median plane of the resonator.

* * * * *

UNITED STATES PATENT AND TRADEMARK OFFICE
CERTIFICATE OF CORRECTION

PATENT NO. : 4,705,982

DATED : November 10, 1987

INVENTOR(S) : Besson et al

It is certified that error appears in the above-identified patent and that said Letters Patent is hereby corrected as shown below:

In Column 6, Line 6, "hearing" should be --bearing--.

Signed and Sealed this

Twenty-fourth Day of January, 1989

Attest:

DONALD J. QUIGG

*Attesting Officer*     *Commissioner of Patents and Trademarks*